United States Patent
Wang

(10) Patent No.: US 12,412,770 B2
(45) Date of Patent: Sep. 9, 2025

(54) TRANSFER COMPONENT AND MANUFACTURING METHOD THEREOF, AND TRANSFER HEAD

(71) Applicant: CHONGQING KONKA PHOTOELECTRIC TECHNOLOGY RESEARCH INSTITUTE CO., LTD., Chongqing (CN)

(72) Inventor: Tao Wang, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 612 days.

(21) Appl. No.: 17/720,715

(22) Filed: Apr. 14, 2022

(65) Prior Publication Data

US 2022/0238368 A1 Jul. 28, 2022

Related U.S. Application Data

(63) Continuation of application No. PCT/CN2020/121903, filed on Oct. 19, 2020.

(51) Int. Cl.
 *H01L 21/683* (2006.01)
 *G03F 7/00* (2006.01)
(52) U.S. Cl.
 CPC ........ *H01L 21/6835* (2013.01); *G03F 7/0015* (2013.01)
(58) Field of Classification Search
 CPC .............. H01L 21/6835; G03F 7/0015
 See application file for complete search history.

(56) References Cited

U.S. PATENT DOCUMENTS

| 5,686,348 | A | 11/1997 | Chao |
| 2006/0273456 | A1 | 12/2006 | Sant et al. |
| 2008/0160767 | A1 | 7/2008 | Ban et al. |
| 2011/0293884 | A1 | 12/2011 | Zhu et al. |
| 2012/0028446 | A1 | 2/2012 | Cheng et al. |
| 2013/0059435 | A1* | 3/2013 | Yang .................... H10D 64/017 257/E21.409 |
| 2018/0236719 | A1* | 8/2018 | Ren ........................ B32B 27/304 |

(Continued)

FOREIGN PATENT DOCUMENTS

| CN | 1493464 | A |   | 5/2004 |
| CN | 101231948 | A | * | 7/2008 |
| CN | 101246307 | A | * | 8/2008 |

(Continued)

OTHER PUBLICATIONS

Notice to Grant Patent Right for Invention issued in corresponding CN application No. 202011119046.7 dated May 10, 2022.

(Continued)

Primary Examiner — Kelly M Gambetta
(74) Attorney, Agent, or Firm — HAUPTMAN HAM, LLP

(57) ABSTRACT

A transfer component and a manufacturing method thereof, and a transfer head are provided in the disclosure. The method includes the following. An elastic adhesive layer is disposed on a surface of a substrate. A reticle with a hollow area is disposed on the elastic adhesive layer. The elastic adhesive layer is etched through the hollow area of the reticle.

14 Claims, 10 Drawing Sheets

(56) References Cited

U.S. PATENT DOCUMENTS

| | | | | |
|---|---|---|---|---|
| 2020/0343340 | A1* | 10/2020 | Fang | H10D 62/83 |
| 2021/0135070 | A1* | 5/2021 | Rinne | H10H 20/854 |

FOREIGN PATENT DOCUMENTS

| | | | | | |
|---|---|---|---|---|---|
| CN | 102142487 | A | | 8/2011 | |
| CN | 103311123 | A | | 9/2013 | |
| CN | 103681977 | A | | 3/2014 | |
| CN | 103903964 | A | | 7/2014 | |
| CN | 105137712 | A | | 12/2015 | |
| CN | 107154374 | A | | 9/2017 | |
| CN | 107799455 | A | | 3/2018 | |
| CN | 207116403 | U | | 3/2018 | |
| CN | 107910413 | A | | 4/2018 | |
| CN | 108319107 | A | | 7/2018 | |
| CN | 110095941 | A | | 8/2019 | |
| CN | 110808227 | A | | 2/2020 | |
| CN | 111108586 | A | | 5/2020 | |
| CN | 111199907 | A | * | 5/2020 | H01L 21/6836 |
| JP | 2016032036 | A | | 3/2016 | |
| KR | 20180086945 | A | | 8/2018 | |
| KR | 101972481 | B1 | | 4/2019 | |

OTHER PUBLICATIONS

International Search Report issued in corresponding International Application No. PCT/CN2020/121903, mailed May 26, 2021.

Huang Zhanxi, MEMS Bulk Silicon Process Based on Multi-mask Photolithograph, dated Jun. 25, 2011.

Song Baosheng, Fabrication of the Patterned Sapphire Substrate by the Imprint Lithography with the Flexible Hybrid Mold, dated Sep. 15, 2013.

The First Office Action issued in corresponding CN application No. 202011119046.7 dated Mar. 25, 2022.

* cited by examiner

TRANSFER COMPONENT AND MANUFACTURING METHOD THEREOF, AND TRANSFER HEAD

CROSS-REFERENCE TO RELATED APPLICATIONS

This application is a continuation of International Application No. PCT/CN2020/121903, filed on Oct. 19, 2020 the entire disclosure of which is incorporated herein by reference.

TECHNICAL FIELD

This disclosure relates to the field of mass transfer, and in particular to a transfer component and a manufacturing method thereof, and a transfer head.

BACKGROUND

A polydimethylsiloxane (PDMS) stamp is an important device used for micro-device mass transfer. At present, the PDMS stamp is mainly manufactured by etching a base plate to form a mold with multiple grooves and then injection molding PDMS in the mold. After the PDMS in the mold is cured, a PDMS with multiple bumps is taken out by rolling over the mold, where the PDMS with multiple bumps is a PDMS stamp with multiple bumps.

Obviously, quality of the PDMS stamp manufactured by this manufacturing scheme is directly related to quality of the mold, but the base plate for forming the mold is usually a sapphire base plate, where the sapphire substrate is difficult to be etched and has a small etch depth, which often leads to an insufficient depth-to-width ratio of the PDMS stamp, such that device transfer requirements cannot be met. Moreover, surfaces of the multiple grooves defined by etching are too rough, resulting in the same rough surfaces of the multiple bumps in the PDMS stamp, which reduces adhesion of the PDMS stamp in a device transfer process and affects a device transfer effect.

Therefore, how to manufacture a high-quality PDMS stamp that meets the device transfer requirements is an urgent problem to-be-solved.

SUMMARY

In a first aspect, a manufacturing method for a transfer component is provided in the disclosure. The method includes the following. An elastic adhesive layer is disposed on a surface of a substrate. A reticle is disposed on the elastic adhesive layer, where a hollow area is defined on the reticle. The elastic adhesive layer is etched through the hollow area of the reticle. The transfer component is obtained by removing the reticle after the etching is completed.

In a second aspect, a transfer component is further provided in the disclosure. The transfer component can be manufactured with any one of the foregoing manufacturing methods for a transfer component.

In a third aspect, a transfer head is further provided in the disclosure. The transfer head includes the transfer component above.

Description of reference signs of the accompanying drawings: 20—sapphire base plate; 200—groove; 21—PDMS stamp; 60—substrate; 61—elastic adhesive layer; 62—reticle; 621—reticle sacrificial layer; 622—reticle basic layer; 63—transfer component; 70—reticle-manufacturing base plate; 71—photoresist layer; 101—photoresist layer; 120—sapphire base plate; 121—gallium nitride-based (GaN-based) epitaxial layer; 122—silicon dioxide ($SiO_2$) layer; 123—photoresist layer; 124—sapphire substrate; 125—PDMS layer.

DETAILED DESCRIPTION

In order to facilitate understanding of the present disclosure, a detailed description will now be given with reference to relevant accompanying drawings. The accompanying drawings illustrate some examples of implementations of the present disclosure. However, the present disclosure can be implemented in many different forms and is not limited to the implementations described herein. On the contrary, these implementations are provided for a more thorough and comprehensive understanding of the present disclosure.

Unless otherwise defined, all technical and scientific terms used herein have the same meaning as commonly understood by those skilled in the art of the present disclosure. The terms used herein in the disclosure are for the purpose of describing implementations only and are not intended to limit the disclosure.

Figure 1:
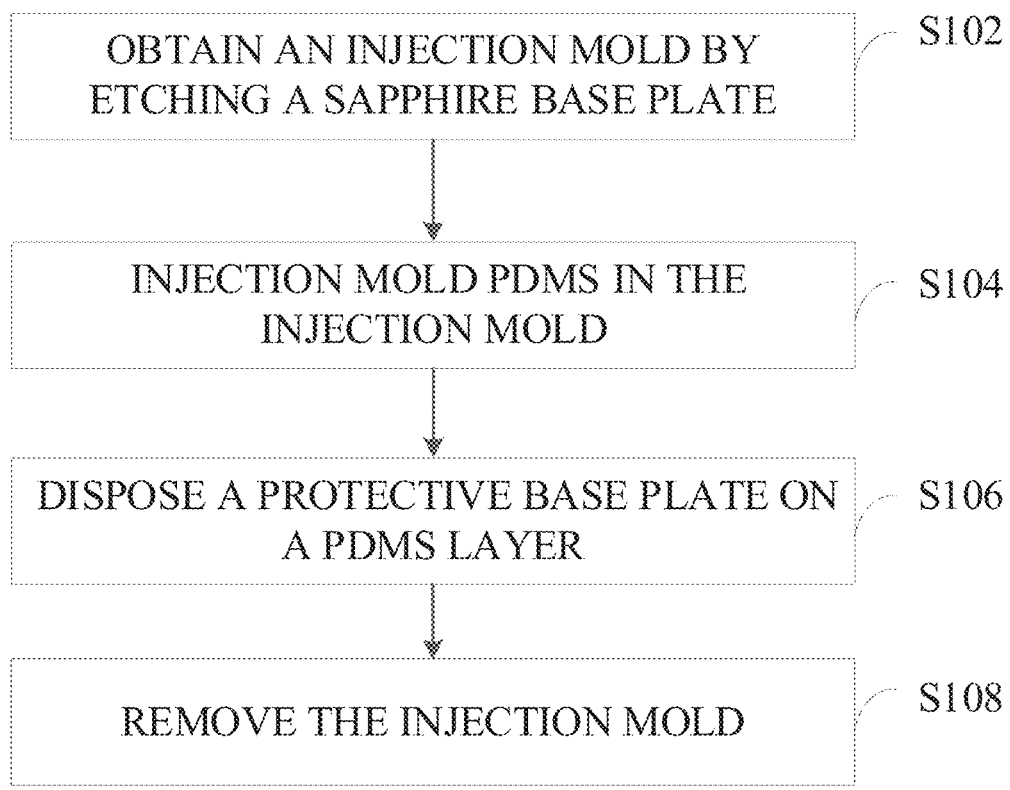
FIG. 1 is a flow chart illustrating manufacturing of a polydimethylsiloxane (PDMS) stamp in the related art illustrated in the disclosure.
Figure 2:
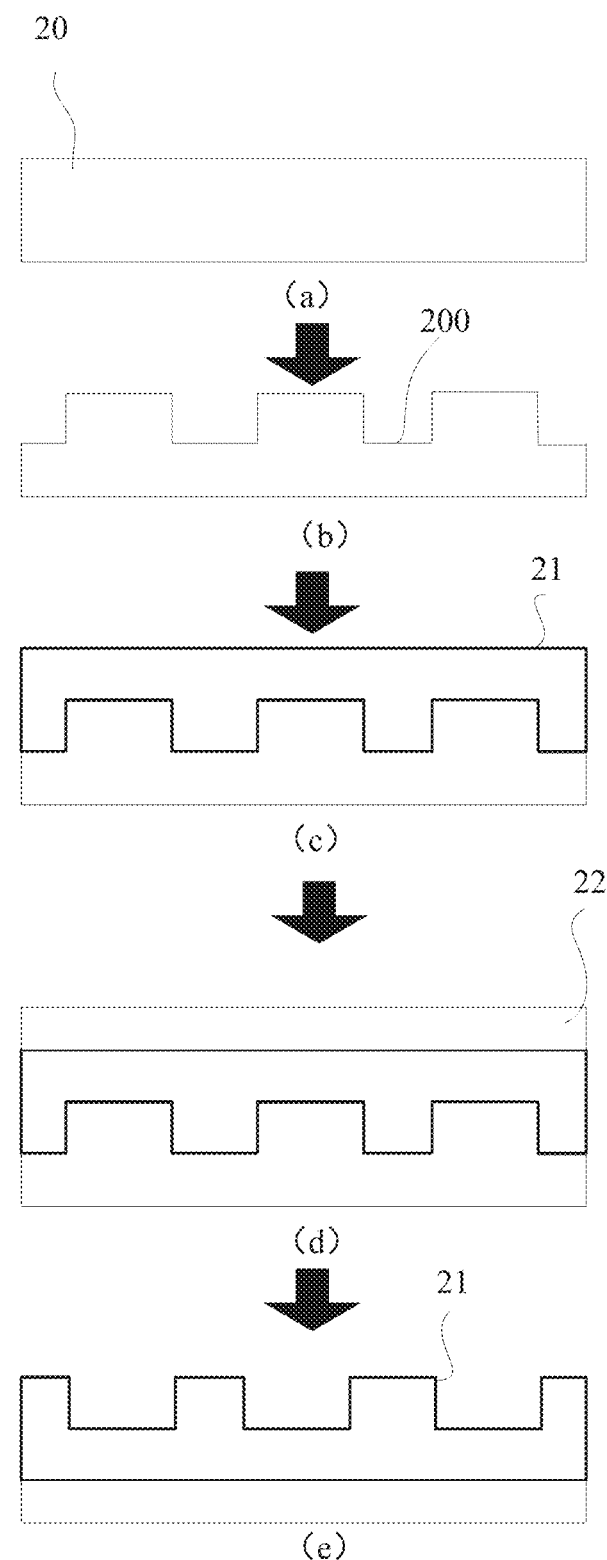
FIG. 2 is a schematic diagram illustrating a state change of each process when a PDMS stamp is manufactured in the related art.

The following will simply describe a process of manufacturing a polydimethylsiloxane (PDMS) stamp in the related art with a combination of a flow chart as illustrated in FIG. 1 and a schematic diagram for a state change of each process as illustrated in FIG. 2.

At S102, an injection mold is obtained by etching a sapphire base plate.

With a combination of FIG. 2 (*a*) and FIG. 2 (*b*), multiple grooves 200 are defined on a sapphire base plate 20 by etching the sapphire base plate 20.

At S104, PDMS is injection molded in the injection mold.

After the injection mold is formed by using the sapphire base plate 20, liquid PDMS can be injection molded in the injection mold, to from a PDMS stamp 21, as illustrated in FIG. 2 (*c*).

At S106, a protective base plate is disposed on a PDMS layer.

A protective base plate 22 is similar to a release film of the PDMS stamp 21, as illustrated in FIG. 2(*d*). In some examples of the implementation, the protective base plate 22 may also be a sapphire base plate.

At S108, the injection mold is removed.

The injection mold can be removed after the PDMS stamp 21 is cured, as illustrated in FIG. 2(*e*), such that the PDMS stamp 21 demolded is obtained.

It can be understood that, each bump in the PDMS Stamp 21 in FIG. 2 has a flat surface and a longitudinal section shape of regular rectangle, which is an ideal condition of the manufacturing scheme in FIG. 1. In practice, there are usually problems at such aspects.

First of all, the sapphire base plate is difficult to be etched and usually has an etch depth that is difficult to exceed 10 microns (μm), and then a height of each bump in the PDMS Stamp 21 may also not exceed 10 μm. However, a difference of heights of three-color (red, green, and blue, RGB) light-emitting diode (LED) chips is usually greater than 5 μm when the three-color LED chips are transferred, so that a bump with a height of 10 μm is difficult to make up the difference of heights of the LED chips, resulting in a low chip transfer yield.

Figure 3:
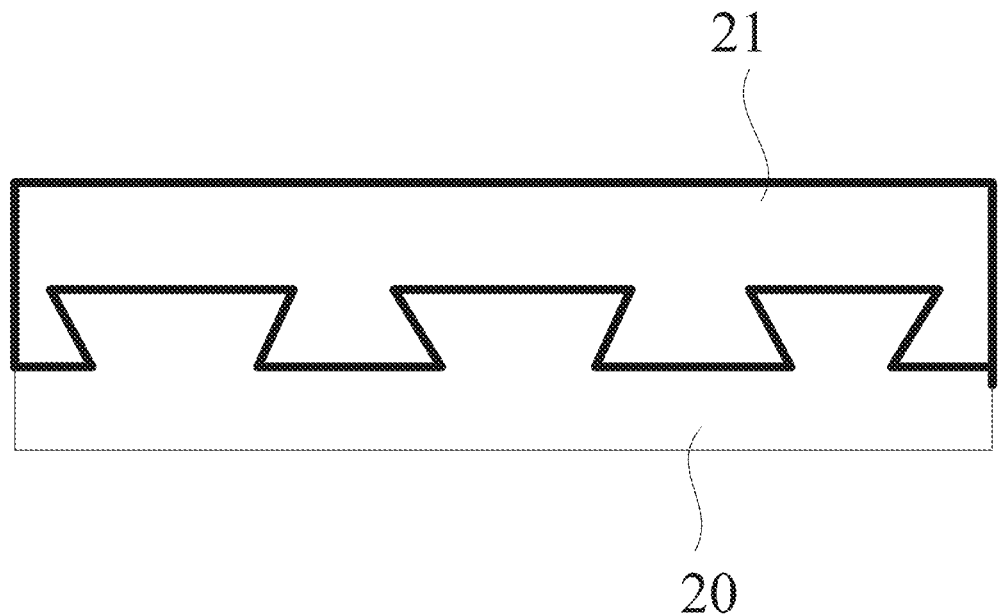
FIG. 3 is a schematic structural diagram illustrating a PDMS stamp in the related art.

Then the sapphire base plate is prone to internal invasion when the sapphire base plate is etched, i.e., each of the multiple grooves defined by etching on the sapphire base plate has a gradually increasing cross section from notch to bottom as illustrated in FIG. 3, which may result in a problem that the PDMS and the injection mold are buckled with each other and thus the injection mold is difficult to be removed.

Figure 4:
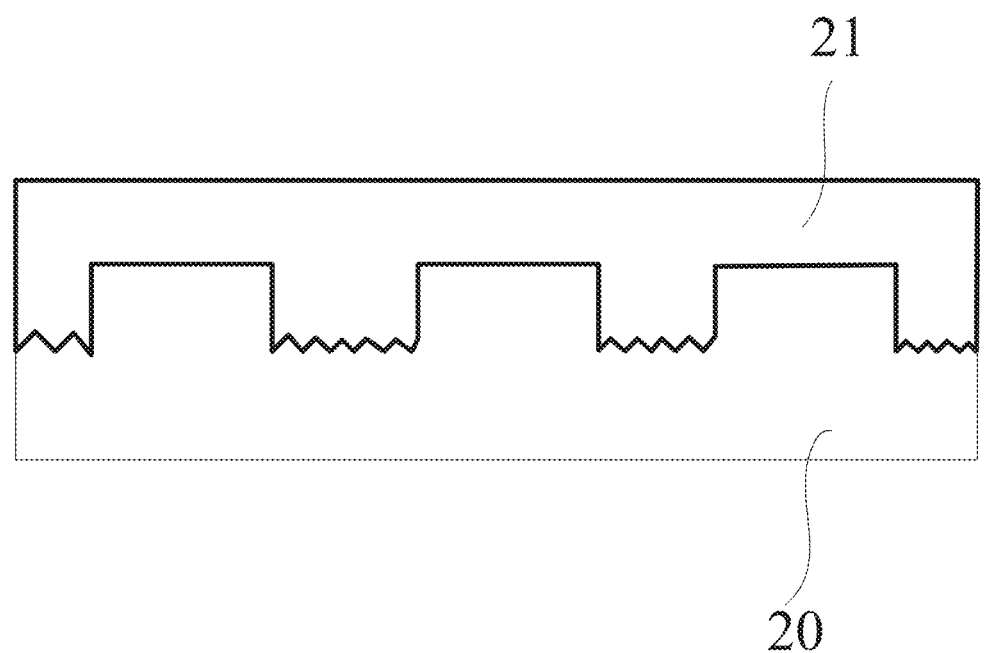
FIG. 4 is another schematic structural diagram illustrating a PDMS stamp in the related art.

Furthermore, an etched surface formed by etching the sapphire base plate, i.e., a bottom of the groove, is rough and unsmooth, which may result in that a surface of the bump, of the PDMS stamp, for device adhering is rough and has low adhesion as illustrated in FIG. 4, thereby affecting a device transfer effect.

Based on the above, a solution is provided in the disclosure, to solve the above-mentioned technical problems. The solution will be explained in details in the following implementations.

Figure 5:
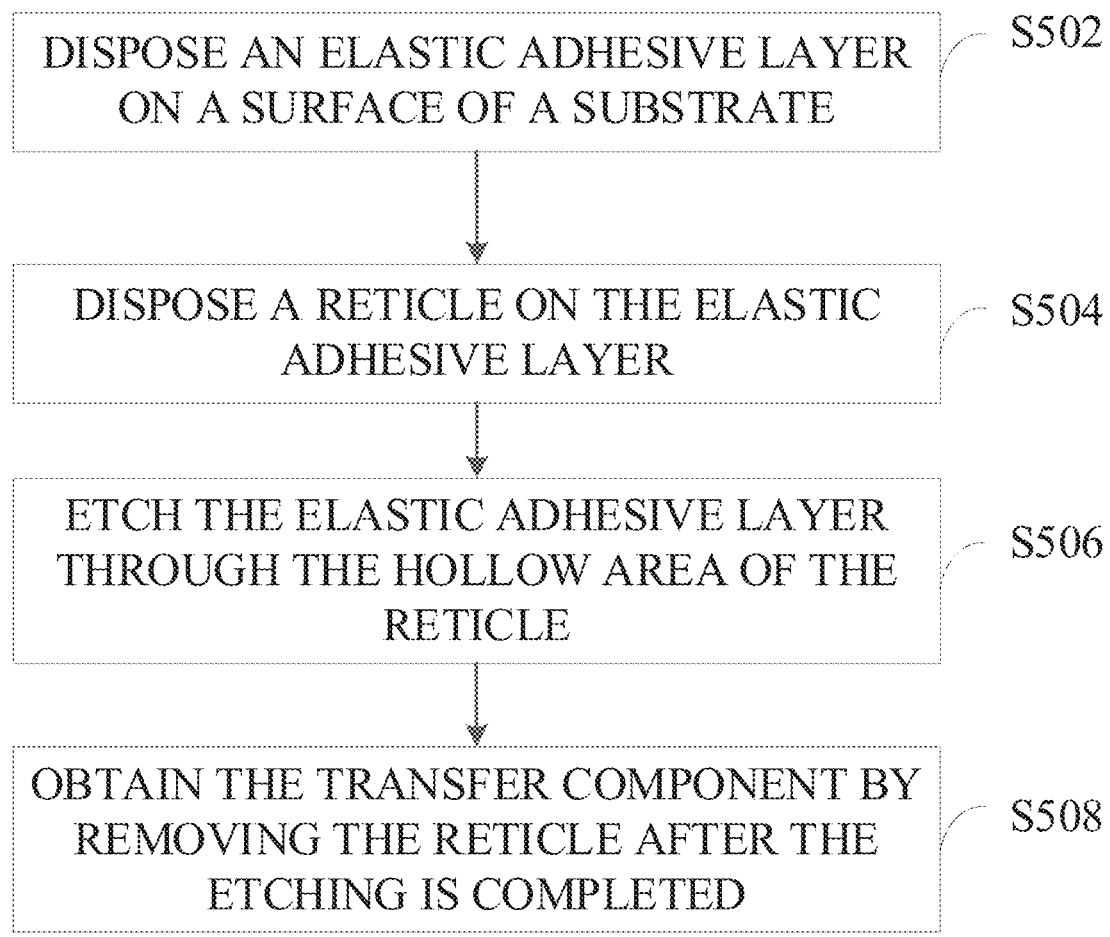
FIG. 5 is a flow chart illustrating a manufacturing method for a transfer component provided in an optional implementation of the disclosure.
Figure 6:
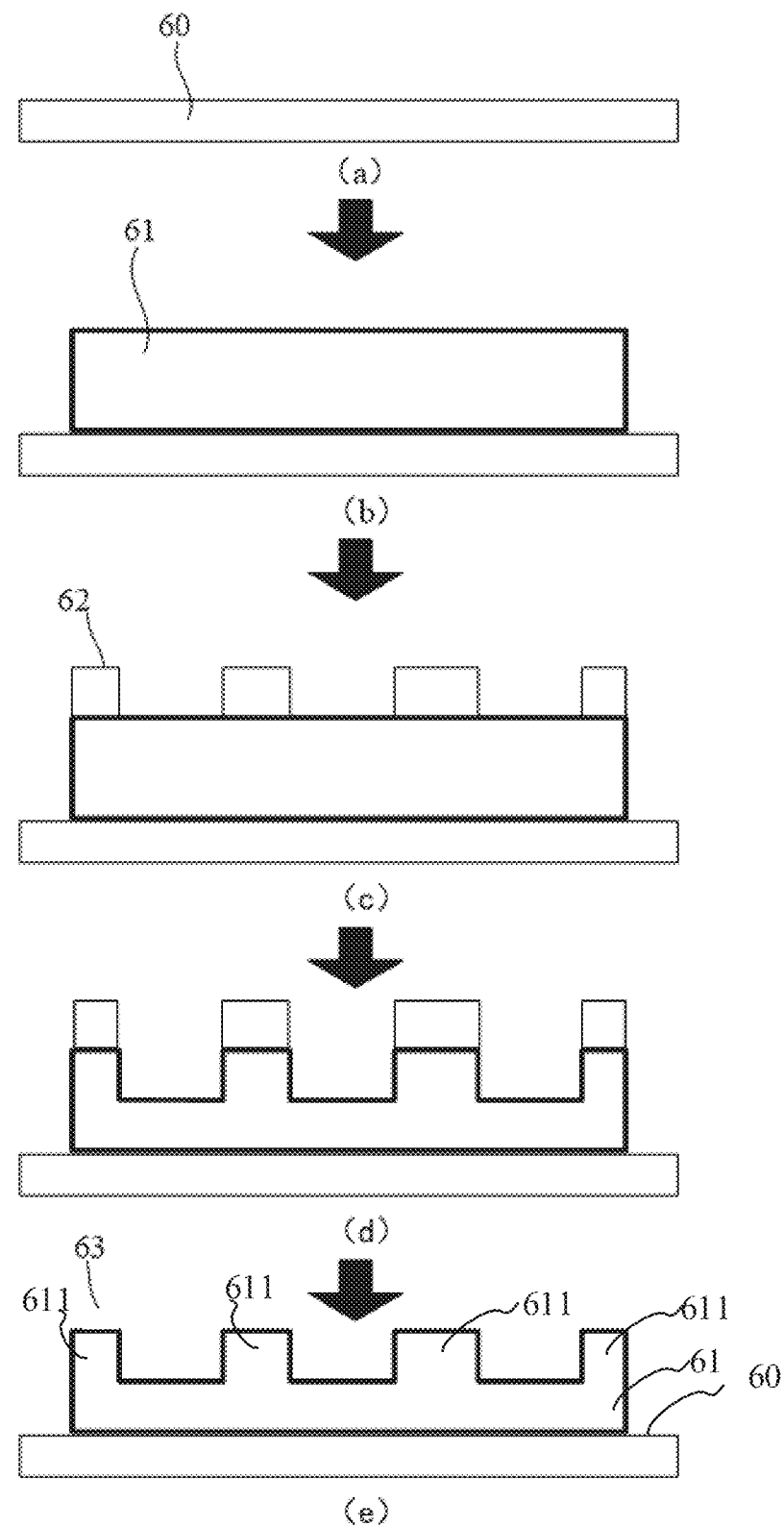
FIG. 6 is a schematic diagram illustrating a state change of each process in FIG. 5.

In an optional implementation, a manufacturing method for a transfer component is provided in the implementation, referring to a flow chart as illustrated in FIG. 5 and a schematic diagram as illustrated in FIG. 6 for a state change of each process.

At S502, an elastic adhesive layer is disposed on a surface of a substrate.

With a combination of FIG. 6 (*a*) and FIG. 6 (*b*), in the implementation, a substrate 60 may be a sapphire base plate. Of course, those skilled in the art can understand that, besides the sapphire base plate, the substrate 60 may also be a base plate or film structure made of other materials, such as a silicon dioxide ($SiO_2$) base plate, a silicon base plate, or the like.

An elastic adhesive layer 61 disposed on a surface of the substrate 60 can be pre-formed and then transferred to the surface of the substrate 60, or can also be directly formed on the surface of the substrate 60. In some examples, the elastic adhesive layer 61 can be formed by an injection molding process.

In some examples of the implementation, the elastic adhesive layer 61 may be a PDMS layer, and in this case, a transfer component manufactured is a PDMS stamp. Of course, those skilled in the art can understand that, a material of the elastic adhesive layer is not limited to PDMS.

At S504, a reticle is disposed on the elastic adhesive layer.

A reticle 62 is a patterned film layer that performs reticle and protection on the elastic adhesive layer 61. It can be understood that, the reticle 62 has relatively concave patterns, and even in some examples, these patterns may also be hollow, e.g., as illustrated in FIG. 6 (*c*), the reticle 62 is a film layer with hollow areas.

Since relatively convex areas in the reticle 62 can protect corresponding areas in the elastic adhesive layer 61, the corresponding areas in the elastic adhesive layer 61 are basically not etched, such that the relatively convex areas in the reticle 62 correspond to bumps in a transfer component finally manufactured. Supposing that the elastic adhesive layer 61 is etched in a certain etching manner, the reticle 62 generally may be insensitive to the certain etching manner, such that the reticle 62 can always protect the corresponding areas in the elastic adhesive layer 61 during etching of the elastic adhesive layer 61.

Figure 7:
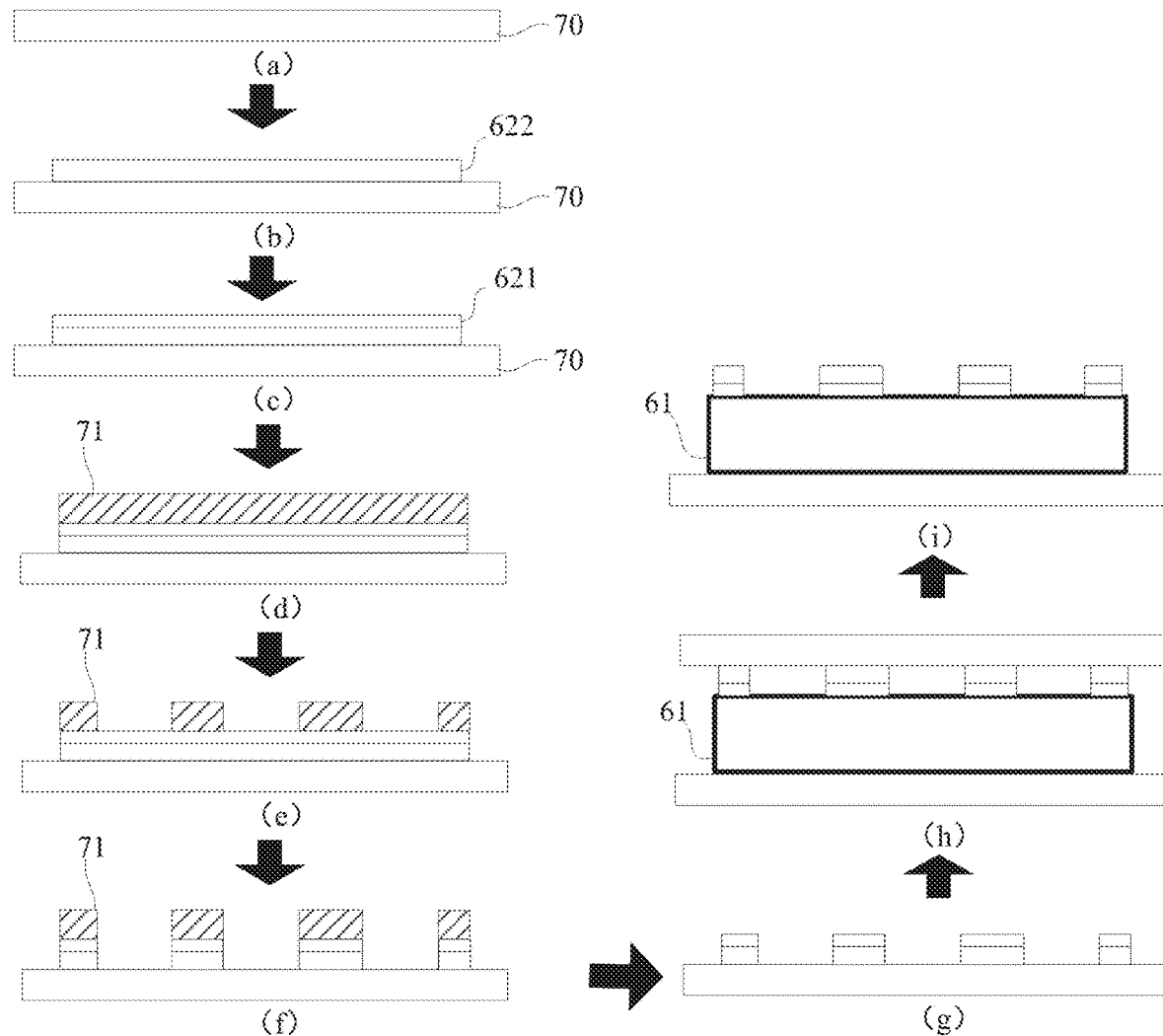
FIG. 7 is a schematic diagram illustrating a state change of a process of disposing a reticle on an elastic adhesive layer.

In some examples of the implementation, as illustrated in FIG. 7, the reticle 62 includes a reticle basic layer 622 and a reticle sacrificial layer 621, and the reticle sacrificial layer 621 is closer to the elastic adhesive layer 61 than the reticle basic layer 622 when the reticle 62 is disposed on the elastic adhesive layer 61. Therefore, the reticle sacrificial layer 621 is attached to the elastic adhesive layer 61 and located between the elastic adhesive layer 61 and the reticle basic layer 622. A material of the reticle basic layer 622 is different from that of the reticle sacrificial layer 621, and roles of the reticle basic layer 622 and the reticle sacrificial layer 621 are also different as follows.

It can be understood that, the reticle basic layer 622 on the top of the reticle 62 is a really exposed layer, therefore during etching, the reticle basic layer 622 needs to protect the reticle sacrificial layer 621 and the elastic adhesive layer 61 each under the reticle basic layer 622. That is, the reticle basic layer 622 during etching is required to be capable of playing a protective role of the reticle 62 to the elastic adhesive layer 61, so that the reticle basic layer 622 may be insensitive to the etching manner for the elastic adhesive layer. In some examples of the implementation, the material of the reticle basic layer 622 may include but is not limited to gallium nitride (GaN). In an example of the implementation, a blue or green LED epitaxial layer grown can be directly used as the reticle basic layer 622, i.e., a GaN-based epitaxial layer is directly used as the reticle basic layer 622. Of course, those skilled in the art can understand that, the GaN-based epitaxial layer includes an N-type GaN layer, a quantum well layer, a P-type GaN layer, and other layer structures, but in fact, the reticle basic layer 622 is not required to have these layer structures and has no requirement on doping. In some examples, the reticle basic layer 622 may be an undoped GaN layer, and in other examples, the reticle basic layer 622 may be a GaN layer doped with silicon, a GaN layer doped with magnesium, or a GaN layer containing other doping sources.

The reticle sacrificial layer 621 is for that the reticle 62 can be removed in a subsequent process without damaging the transfer component, e.g., the reticle sacrificial layer 621 can react chemically with some solvents, but this chemical reaction may not affect the elastic adhesive layer, such that the transfer component can be separated from the reticle 62 without damaging the transfer component. In some examples of the implementation, the reticle sacrificial layer 621 may include but is not limited to at least one of a $SiO_2$ layer or a silicon nitride ($Si_3N_4$) layer.

Of course, those skilled in the art can understand that, the reticle also may have a layer structure which is made of only one material, e.g., in an example, the reticle 62 is made of GaN, and according to the above introduction, a reticle of GaN can protect an area of the elastic adhesive layer covered by the reticle during etching of the elastic adhesive layer 61. The reticle 62 can also be removed by laser decomposition when the transfer component is manufactured and the reticle needs to be peeled off. Moreover, a high-quality transfer component can also be obtained by appropriately controlling energy and time of laser irradiation on the reticle 62.

Figure 8:
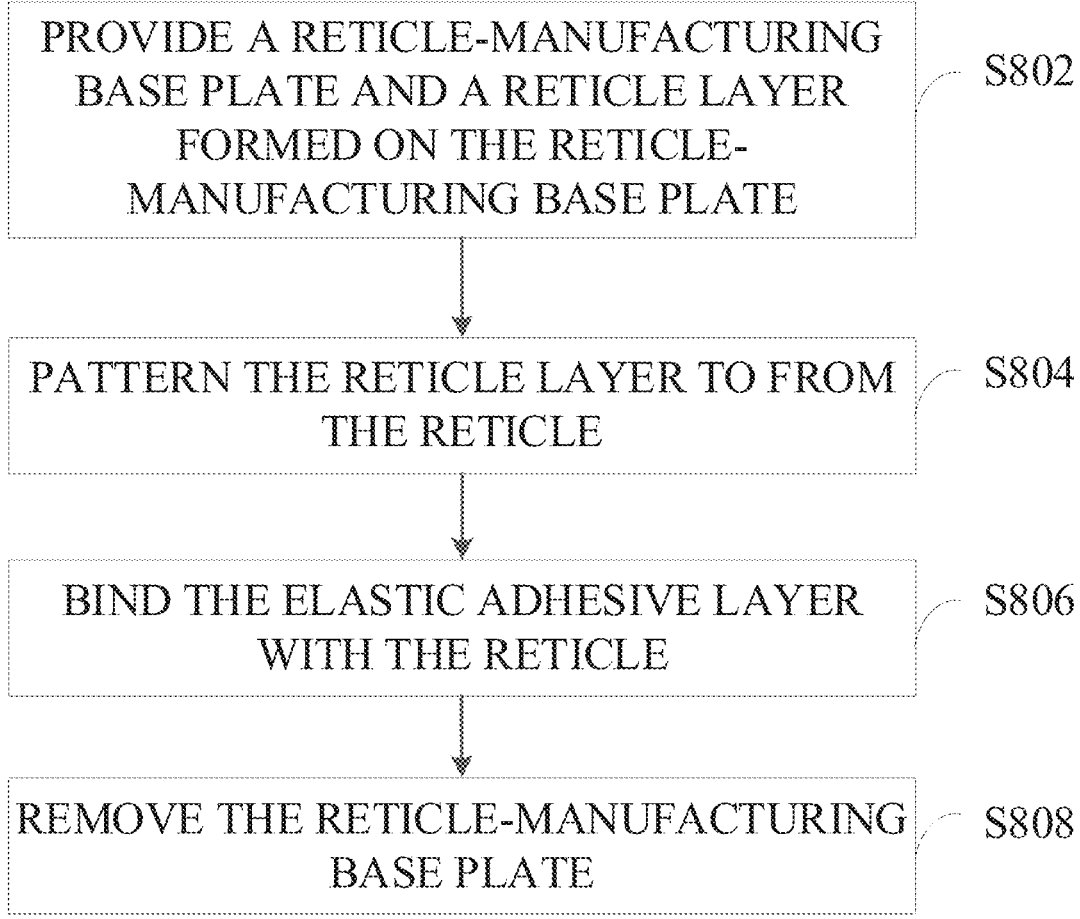
FIG. 8 is a flow chart illustrating arrangement of a reticle on an elastic adhesive layer.

In some examples of the implementation, the reticle 62 can be formed separately and then transferred onto the elastic adhesive layer 61, referring to a flow chart of arrangement of a reticle on an elastic adhesive layer as illustrated in FIG. 8.

At S802, a reticle-manufacturing base plate and a reticle layer formed on the reticle-manufacturing base plate are provided.

In the implementation, a reticle-manufacturing base plate 70 may include but is not limited to a sapphire base plate. Since the reticle sacrificial layer 621 in the reticle 62 is closer to the elastic adhesive layer 61, when the reticle 62 on the reticle-manufacturing base plate 70 is transferred onto the elastic adhesive layer 61, a surface of the reticle 62 closing to the reticle-manufacturing base plate 70 may be away from the elastic adhesive layer 61, and a surface of the reticle 62 away from the reticle-manufacturing base plate 70 may be attached to the elastic adhesive layer 61. Therefore, when the reticle 62 is formed on the reticle-manufacturing base plate 70, the reticle basic layer 622 is required to be formed on the reticle-manufacturing base plate 70 first, and then the reticle sacrificial layer 621 is required to be formed on the reticle basic layer 622, where the reticle basic layer 622 and the reticle sacrificial layer 621 together constitute the reticle layer, with a combination of FIG. 7 (*a*) to FIG. 7 (*c*).

In some examples of the implementation, a GaN layer may be temporarily grown on a sapphire base plate as the reticle basic layer 622. In other examples of the implementation, a GaN-based epitaxial layer with the sapphire base plate can be provided directly. As such, a process that the reticle-manufacturing base plate is provided and the reticle basic layer 622 is formed on the reticle-manufacturing base plate 70 is omitted, facilitating improving a manufacturing efficiency of the reticle, and the GaN-based epitaxial layer can be manufactured by an LED chip manufacturer using a complete production line, avoiding overheads caused by a transfer component manufacturer purchasing a GaN-layer forming device, and reducing a production cost.

The reticle sacrificial layer 621 is formed by various processes which include but are not limited to any one of vacuum evaporating (EV), physical vapour deposition (PVD), or plasma enhanced chemical vapor deposition (PECVD).

At S804, the reticle layer is patterned to from the reticle.

A photolithography process can be used when the reticle layer is patterned, e.g., in some examples of the implementation, a photoresist layer 71 can be disposed on the reticle layer, as illustrated in FIG. 7 (*d*). A patterned photoresist layer 71 is obtained by exposing and developing the photoresist layer, referring to FIG. 7 (*e*). It can be understood that, before exposing the photoresist layer 71, a patterned exposure reticle needs to be disposed on the photoresist layer 71 according to the characteristic of the photoresist layer 71 (e.g., positive photoresist or negative photoresist), where the photolithography process is more mature and thus will not be repeated herein. After the patterned photoresist layer 71 is obtained, a patterned reticle 62 can be obtained by etching the reticle layer under reticle of the photoresist layer 71, as illustrated in FIG. 7 (*f*). A process of etching the reticle layer may include but is not limited to dry etching, wet etching, or the like. Generally, etching of the reticle layer may damage the photoresist layer 71 to some extent but may not etch all of the photoresist layer 71, and the photoresist layer 71 is not a part of the reticle 62, such that the patterned photoresist layer 71 needs to be removed after a reticle 62 with multiple hollow areas is obtained in the implementation, as illustrated in FIG. 7 (*g*).

At S806, the elastic adhesive layer is bound with the reticle.

The reticle sacrificial layer 621 of the reticle 62 may be exposed after the photoresist layer 71 is removed, as illustrated in FIG. 7 (*g*), in this case, a side of the reticle 62 can be disposed to be closer to the elastic adhesive layer 61 with the aid of the reticle-manufacturing base plate 70, thereby adhering the reticle sacrificial layer 621 onto the elastic adhesive layer 61, as illustrated in FIG. 7 (*h*).

At S808, the reticle-manufacturing base plate is removed.

The reticle-manufacturing base plate 70 needs to be removed after the reticle 62 is transferred onto the elastic adhesive layer 61, as illustrated in FIG. 7 (*i*). In some examples of the implementation, since the reticle-manufacturing base plate 70 is a sapphire base plate and the reticle basic layer 622 is a GaN layer, when the reticle-manufacturing base plate 70 is separated from the reticle basic layer 622, GaN can be decomposed by laser, and binding between the reticle-manufacturing base plate 70 and the reticle basic layer 622 can be damaged according to a principle of GaN→Ga+$N_2$.

In some examples of the implementation, a wavelength of a laser used for decomposing the GaN layer may be selected randomly, e.g., in some examples, a laser with a wavelength of 266 nanometers (nm) can be selected to decompose the GaN layer. It can be understood that, it does not mean that a laser with a wavelength other than 266 nm definitely has a poor effect on decomposition of the GaN layer or is unable to be used for decomposition of the GaN layer, but because there already exists a laser device for emitting a laser with a wavelength of 266 nm, which is easy to be obtained. In fact, if a laser device for emitting a laser with a wavelength other than 266 nm is developed in the future, e.g., laser devices for emitting a laser with a wavelength of 255 nm, 258 nm, or 260 nm, these laser devices each can also be used. In other examples of the implementation, a laser with a wavelength of 355 nm can be selected to decompose the GaN layer. In the same way, if there are laser devices for emitting a laser with a wavelength of 354 nm, 356 nm, or 358 nm, these laser devices each can also be used.

Figure 9:
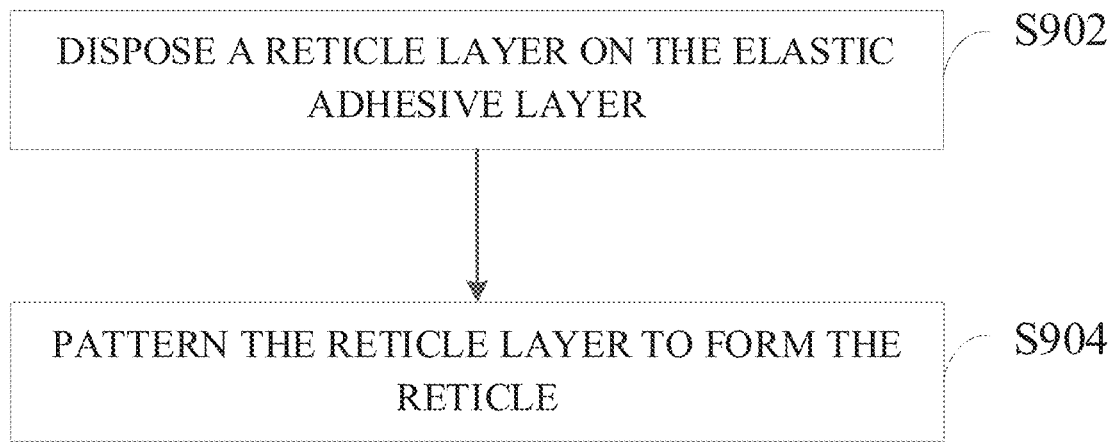
FIG. 9 is another flow chart illustrating arrangement of a reticle on an elastic adhesive layer.

In other examples of the implementation, the reticle 62 is directly formed on the elastic adhesive layer 61, referring to another flow chart of arrangement of a reticle on the elastic adhesive layer 61 as illustrated in FIG. 9.

At S902, a reticle layer is disposed on the elastic adhesive layer.

Figure 10:
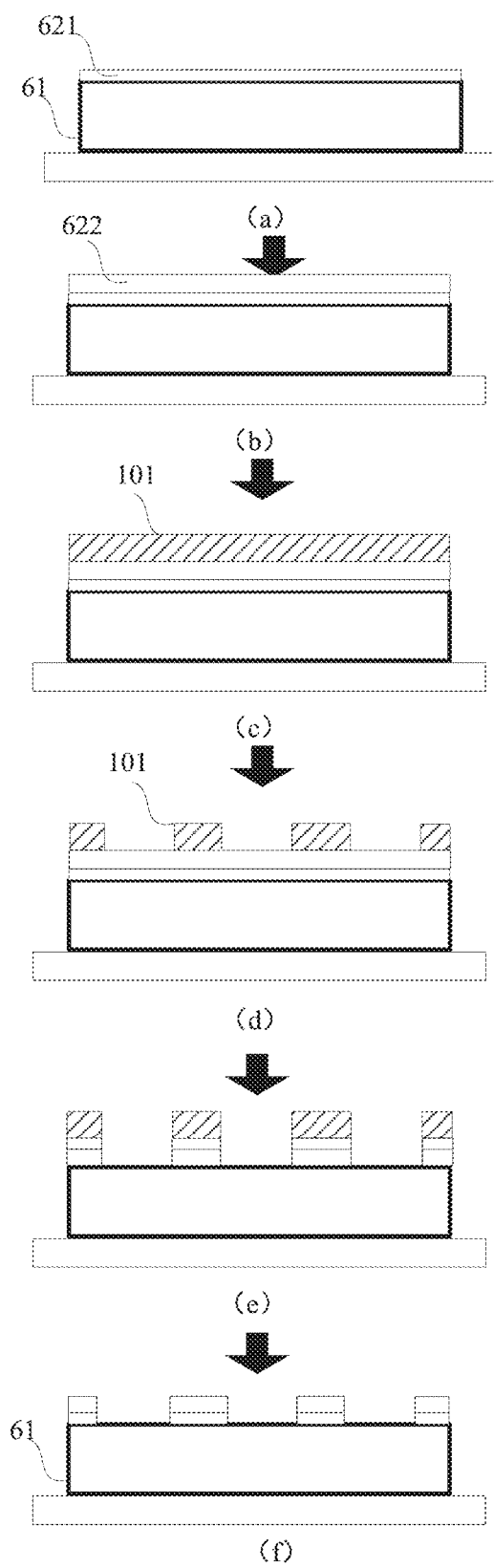
FIG. 10 is another schematic diagram illustrating a state change of a process of disposing a reticle on an elastic adhesive layer.

Referring to FIG. 10 (*a*) and FIG. 10 (*b*), since the reticle sacrificial layer 621 in the reticle 62 is closer to the elastic adhesive layer 61, when the reticle 62 is directly formed on the elastic adhesive layer 61, the reticle sacrificial layer 621 can be disposed on the elastic adhesive layer 61, and then the reticle basic layer 622 can be disposed on the reticle sacrificial layer 621, where the reticle sacrificial layer 621 and the reticle basic layer 622 together constitute the reticle layer. In other examples of the implementation, the reticle basic layer 622 can also be separately formed, and then the reticle sacrificial layer 621 can be formed on the reticle basic layer 622 by using one of EV, PVD, PECVD, or the like. Then a surface of the reticle sacrificial layer 621 away from the reticle basic layer 622 is adhered to the elastic adhesive layer 61 by using adhesiveness of the elastic adhesive layer 61. Alternatively, the reticle sacrificial layer 621 can also be separately formed, then the reticle basic layer 622 can be formed on the reticle sacrificial layer 621, and the reticle sacrificial layer 621 is bound with the elastic adhesive layer 61.

In this scheme for disposing a reticle, in the same way, a GaN-based epitaxial layer pre-manufactured can be used as the reticle basic layer. For example, the GaN-based epitaxial layer is peeled off from its growth base plate by laser and then adhered onto the elastic adhesive layer 61. Alternatively, the GaN-based epitaxial layer with the growth base plate is adhered onto the elastic adhesive layer 61, and then the growth base plate is peeled off by laser.

At S904, the reticle layer is patterned to form the reticle.

The reticle layer can be patterned to form the reticle 62 after the reticle layer is disposed on the elastic adhesive layer 61. In this scheme for directly forming the reticle 62 on the elastic adhesive layer 61, the process of patterning the reticle layer is similar to a scheme that the reticle 62 is separately formed and then transferred to a PDMS layer i.e., the elastic adhesive layer 61, which also includes the following. Dispose a photoresist layer 101 on the reticle layer, as illustrated in FIG. 10 (c), then a patterned photoresist layer 101 is obtained by exposing and developing the photoresist layer, as illustrated in FIG. 10 (d), after the patterned photoresist layer 101 is obtained, a patterned reticle 62 can be obtained by etching the reticle layer under reticle of the photoresist layer 101, as illustrated in FIG. 10 (e), and the patterned photoresist layer 101 needs to be removed after the reticle 62 is obtained, as illustrated in FIG. 10 (f).

At S506, the elastic adhesive layer is etched through the hollow area of the reticle.

The elastic adhesive layer 61 can be etched under protection of the reticle 62 after the reticle 62 is disposed on the elastic adhesive layer 61, as illustrated in FIG. 6 (d). It can be understood that, a process of etching the elastic adhesive layer 61 may include dry etching, wet etching, or the like. In some examples of the implementation, the elastic adhesive layer 61 can be dry etched by an inductively coupled plasma (ICP) manner. Optionally, at least one of oxygen ($O_2$), argon (Ar), or boron trifluoride ($BCl_3$) can be used to etch the elastic adhesive layer 61 when the elastic adhesive layer 61 is etched by the ICP manner.

There is no doubt that, a thickness of the reticle 62 and a thickness of the elastic adhesive layer 61 can be randomly set, such that a transfer component 63 with a greater depth-to-width ratio can be obtained by etching as needed.

At S508, the transfer component is obtained by removing the reticle after the etching is completed.

It can be understood that, the transfer component 63 is actually formed after the elastic adhesive layer 61 is etched, but in this case, the transfer component 63 is still a transfer component that has not yet separated from the reticle 62. Therefore, for obtaining a separate transfer component 63, the reticle 62 needs to be removed, as illustrated in FIG. 6 (e). As can be seen from FIG. 6 (e), the separate transfer component 63 includes the substrate 60 and the etched elastic adhesive layer 61. The etched elastic adhesive layer 61 is disposed on the substrate 60, and the etched elastic adhesive layer 61 is provided with multiple bumps 611 on a surface away from the substrate.

If the reticle 62 include the reticle sacrificial layer 621, it can be considered to remove the reticle 62 in a way that the reticle sacrificial layer 621 can be removed without substantially damaging the transfer component 63. For example, the elastic adhesive layer 61 and the reticle 62 can be put in a target solution, and the reticle sacrificial layer 621 of the reticle 62 can be corroded by using the target solution, thereby damaging the binding between the transfer component 63 and the reticle 62. It can be understood that, the target solution has no effect on the elastic adhesive layer 61, or a reaction speed of the target solution with the elastic adhesive layer 61 may also be less than or even far less than that of the target solution with the reticle sacrificial layer 621 even if the target solution can be chemically reacted with elastic adhesive layer 61.

In some examples of the implementation, the reticle sacrificial layer 621 is made of $SiO_2$, so that a buffered oxide etch (BOE) solution can be selected as the target solution. The elastic adhesive layer 61 and the reticle 62 are put in the BOE solution, to corrode the reticle sacrificial layer 621 of the reticle 62 by the BOE solution, thereby obtaining a separate and complete transfer component.

A transfer component is further provided in the implementation, where the transfer component can be manufactured based on the manufacturing method for a transfer component in any one of the foregoing examples.

The above transfer component is manufactured by disposing an elastic adhesive layer on a surface of a substrate, disposing a reticle provided with a hollow area on the elastic adhesive layer, and etching the elastic adhesive layer through the reticle, where the elastic adhesive layer is easy to be etched, such that the transfer component has a great depth-to-width ratio to be able to meet transfer requirements of various devices. In addition, since a surface of the transfer component for adhering to a device to-be-transferred is not an etched surface, the surface is more flat and has strong adhesion, thereby producing a better device transfer effect. Furthermore, since a process of manufacturing the transfer component is not related with a process that the transfer component is taken out by rolling over a mold, there is no such problem that the mold is difficult to be removed existed in the related art. Therefore, the transfer component provided in the disclosure not only has low difficulty in manufacturing process, but also is easy to be produced, which is beneficial to reducing a production cost. Moreover, the transfer component has excellent quality and meets transfer requirements, which is beneficial to improving an efficiency of device mass transfer.

In addition, a transfer head is further provided in the implementation, where the transfer head includes the transfer component.

The above transfer head includes the transfer component. During manufacturing, the transfer component is manufactured by disposing an elastic adhesive layer on a surface of a substrate, disposing a reticle provided with a hollow area on the elastic adhesive layer, and etching the elastic adhesive layer through the reticle, where the elastic adhesive layer is easy to be etched, such that the transfer component has a great depth-to-width ratio to be able to meet transfer requirements of various devices. In addition, since a surface of the transfer component for adhering to a device to-be-transferred is not an etched surface, the surface is more flat and has strong adhesion, thereby improving a device transfer effect of the transfer head. Furthermore, since a process of manufacturing the transfer component is not related with a process that the transfer component is taken out by rolling over a mold, there is no such problem that the mold is difficult to be removed existed in the related art. Therefore, the transfer head provided in the disclosure not only has low difficulty in manufacturing process, but also is easy to be produced, which is beneficial to reducing a production cost. Moreover, the transfer head has excellent quality and meets transfer requirements, which is beneficial to improving an efficiency of device mass transfer.

Considering the disadvantages of the related art mentioned above, in the disclosure, a polydimethylsiloxane (PDMS) stamp and a manufacturing method thereof are provided, which aims to solve problems that the PDMS stamp manufactured by a manufacturing scheme for a PDMS stamp in the related art cannot meet device transfer requirements and a device transfer effect is not good. A manufacturing method for a transfer component is provided in the disclosure. The method includes the following. An elastic adhesive layer is disposed on a surface of a substrate. A reticle is disposed on the elastic adhesive layer, where a hollow area is defined on the reticle. The elastic adhesive layer is etched through the hollow area of the reticle. The transfer component is obtained by removing the reticle after the etching is completed.

In the manufacturing method for a transfer component above, the elastic adhesive layer is disposed on the surface of the substrate, the reticle provided with the hollow area is disposed on the elastic adhesive layer, and the elastic adhesive layer is etched through the reticle. Compared with etching a sapphire base plate, etching the elastic adhesive layer is easier. Moreover, as long as the elastic adhesive layer is thick enough, a transfer component with a greater depth-to-width ratio can be obtained by etching, which can meet transfer requirements of various devices. In addition, since a surface of the transfer component for adhering to a device to-be-transferred is not an etched surface, the surface is more flat and has strong adhesion, thereby producing a better device transfer effect. Furthermore, since a process of manufacturing the transfer component is not related with a process that the transfer component is taken out by rolling over a mold, there is no such problem that the mold is difficult to be removed existed in the related art. Therefore, not only does the manufacturing method for a transfer component provided in the disclosure have low difficulty in a manufacturing process, but also the transfer component manufactured has excellent quality and meets the device transfer requirements, which is beneficial to improving an efficiency and yield of device mass transfer.

In the manufacturing method for a transfer component provided in the implementation, in which operations in the related art that an injection mold is obtained by etching a sapphire base plate, PDMS is injection molded in the injection mold, and a PDMS stamp is obtained by rolling over and removing the injection mold are abandoned, a reticle is disposed on an elastic adhesive layer, the elastic adhesive layer is directly etched under protection of the reticle, and a transfer component is obtained by removing the reticle. In the scheme provided in the implementation, there is no need to etch the sapphire base plate, but the elastic adhesive layer can be directly etched, where the elastic adhesive layer is less difficult to be etched and can obtain a greater depth-to-width ratio. For example, generally, a height of a bump in the transfer component may be greater than 50 μm, and a great depth-to-width ratio can better meet device transfer requirements. In this case, since a surface of the bump, in the transfer component, for adhering to a device to-be-transferred is not an etched surface, the surface of the bump for adhering to the device to-be-transferred is flat and has strong adhesion. Furthermore, the manufacturing scheme for a transfer component provided in the implementation is not related with a process of rolling over and removing the injection mold, therefore, there may be no difficulty in removing the mold due to internal invasion of grooves of the injection mold, which simplifies a manufacturing process of the transfer component, reduces a production difficulty of the transfer component, and improves quality of the transfer component.

Figure 11:
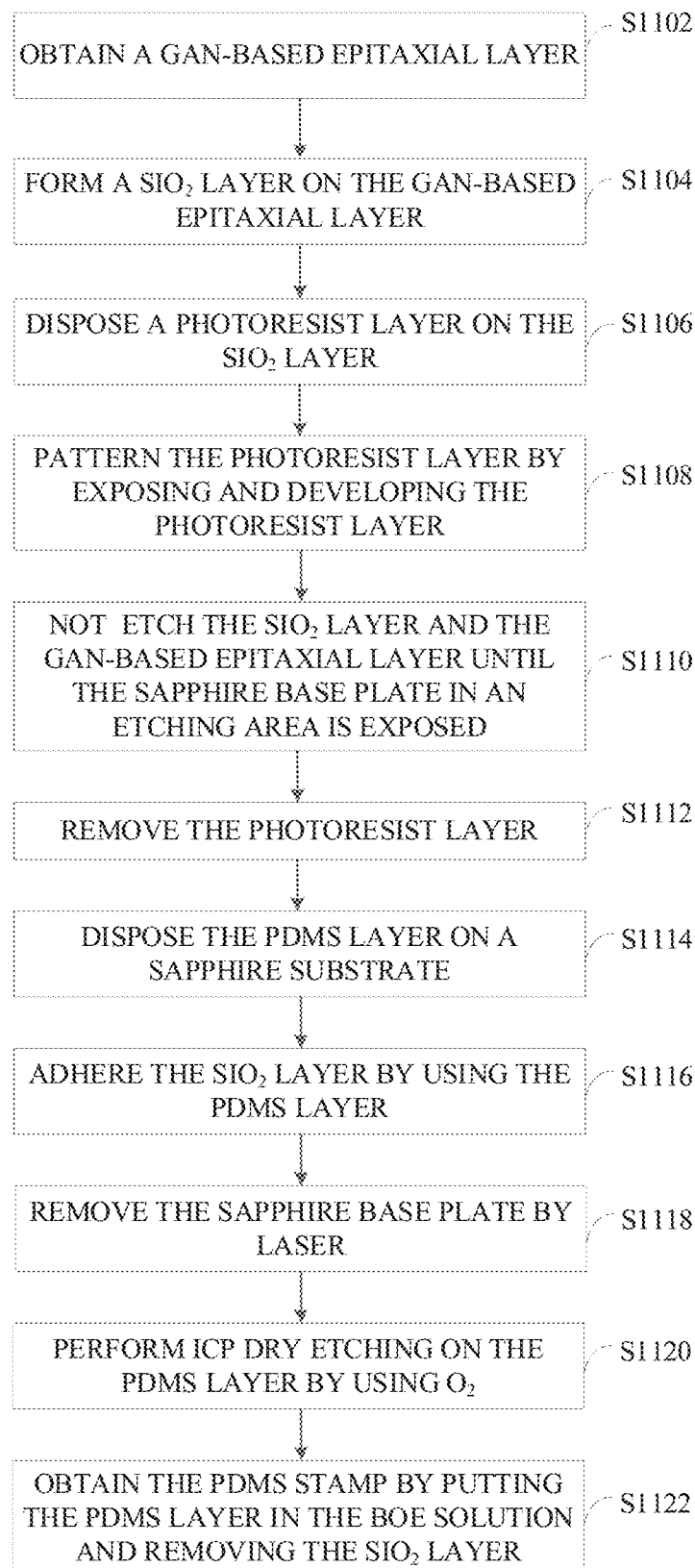
FIG. 11 is a flow chart illustrating a manufacturing method for a transfer component provided in another optional implementation of the disclosure.
Figure 12:
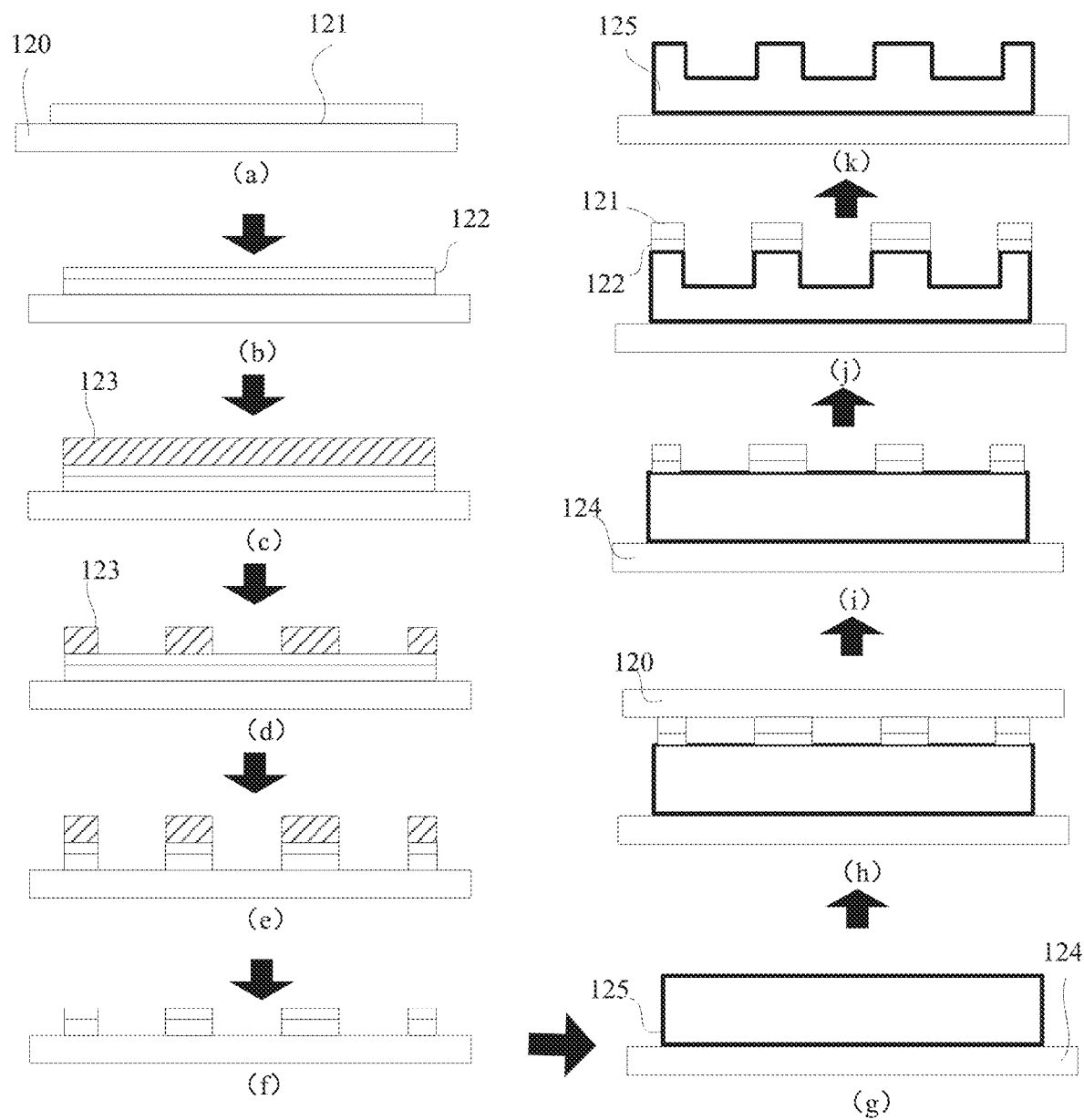
FIG. 12 is a schematic diagram illustrating a state change of each process in FIG. 11.

In another optional implementation, in order to make those skilled in the art more clear about advantages and details of the foregoing manufacturing method for a transfer component, in this implementation, for example, an elastic adhesive layer is a PDMS layer, and the transfer component is a PDMS stamp, to illustrate a process of manufacturing the transfer component, referring to a flow chart as illustrated in FIG. 11 with a combination of a schematic diagram of a state change of each process as illustrated in FIG. 12.

At S1102, a GaN-based epitaxial layer is obtained.

It can be understood that, the GaN-based epitaxial layer may be an epitaxial layer of a blue or green LED chip, which is a GaN layer grown on a sapphire base plate. Therefore, as illustrated in FIG. 12 (a), a blue or green LED epitaxial layer with the sapphire base plate can be directly selected, where a GaN-based epitaxial layer 121 is used as a reticle basic layer, and a sapphire base plate 120 can be used as a reticle-manufacturing base plate.

At S1104, a $SiO_2$ layer is formed on the GaN-based epitaxial layer.

In the implementation, a $SiO_2$ layer 122 is used as a reticle sacrificial layer, and in other examples of the implementation, the $SiO_2$ layer can be replaced by a $Si_3N_4$ layer.

Optionally, the $SiO_2$ layer can be deposited by using a PECVD process when the $SiO_2$ layer is formed on the epitaxial layer 121, as illustrated in FIG. 12 (b).

At S1106, a photoresist layer is disposed on the $SiO_2$ layer.

With a combination of FIG. 12 (c), in this example, a photoresist material for forming a photoresist layer 123 may be a positive photoresist or a negative photoresist.

At S1108, the photoresist layer is patterned by exposing and developing the photoresist layer.

There is no doubt that, before exposing the photoresist layer 123, a corresponding exposure reticle further needs to be disposed on the photoresist layer 123 according to whether the photoresist layer 123 is a positive photoresist layer or a negative photoresist layer, which will not be illustrated in details. The photoresist layer 123 is patterned after exposing and developing the photoresist layer 123, as illustrated in FIG. 12 (d).

At S1110, the $SiO_2$ layer and the GaN-based epitaxial layer are etched until the sapphire base plate in an etching area is exposed.

Referring to FIG. 12 (e), the $SiO_2$ layer 122 and the GaN-based epitaxial layer 121 can be etched sequentially under protection of the photoresist layer 123 after the photoresist layer 123 is patterned, thereby patterning the reticle layer. In the implementation, when the reticle layer is etched, the $SiO_2$ layer 122 and the GaN-based epitaxial layer 121 each exposed beyond the photoresist layer 123 are etched sequentially until the sapphire base plate is exposed.

At S1112, the photoresist layer is removed.

The photoresist layer 123 can be removed after the GaN-based epitaxial layer 121 and the SiO$_2$ layer 122 are etched, to expose the SiO$_2$ layer 122, as illustrated in FIG. 12 (f).

At S1114, the PDMS layer is disposed on a sapphire substrate.

With a combination of FIG. 12 (g), in the implementation, a sapphire substrate 124 also is a sapphire base plate, where different terms of "base plate" and "substrate" are used here only in order to distinguish by name a sapphire base plate on which a PDMS layer 125 is carried from a sapphire base plate on which the epitaxial layer 121 is grown.

The PDMS layer 125 can be formed by an injection molding process. It needs to be noted that, in FIG. 12, the reticle is formed on the sapphire base plate 120, and then the PDMS layer 125 is formed on the sapphire substrate 124, but in other examples of the implementation, the two processes can be reversed in timing or can be performed simultaneously.

At S1116, the PDMS layer is used to adhere the SiO$_2$ layer.

In fact, the PDMS layer 125 is made of an organic silica gel and has adhesiveness, so that a surface of the PDMS layer 125 away from the sapphire substrate can be used to adhere to the SiO$_2$ layer 122, as illustrated in FIG. 12 (h). The PDMS layer 125 can be bound with the SiO$_2$ layer 122 at low temperature, e.g., at room temperature, where the room temperature in the implementation ranges from 5° C. to 40° C.

At S1118, the sapphire base plate is removed by laser.

In the implementation, at least one of a laser with a wavelength of 266 nm or a laser with a wavelength of 355 nm can be used to irradiate the GaN-based epitaxial layer 121 from a side of the sapphire base plate 120, to remove the sapphire base plate 120 by a laser lift-off (LLO) process, as illustrated in FIG. 12 (i).

At S1120, ICP dry etching is performed on the PDMS layer by using O$_2$.

The PDMS layer 125 can be etched under protection of the reticle after the sapphire base plate 120 is removed, as illustrated in FIG. 12 (j). Since the PDMS layer 125 is made of an organic silica gel and thus can be etched by O$_2$, in the implementation, the PDMS layer 125 can be etched by O$_2$ in the ICP dry etching manner, to form the PDMS stamp. It can be understood that, an etch depth can be controlled according to at least one of flow of O$_2$ or an etching duration, and the PDMS stamp can reach a greater depth-to width ratio on condition that the PDMS layer 125 is thick enough.

At S1122, the PDMS stamp is obtained by putting the PDMS layer in the BOE solution and removing the SiO$_2$ layer.

A semi-manufactured PDMS stamp can be put in the BOE solution after the PDMS layer 125 is etched, and then the SiO$_2$ layer 122 is melted and corroded by chemically reacting with the BOE solution, so that a PDMS stamp separated from the reticle is obtained, as illustrated in FIG. 12 (k).

The PDMS stamp manufactured in the implementation is mainly used to transfer a micro device including an LED chip, or the like. For example, in some examples of the implementation, the PDMS stamp manufactured can be used to transfer at least one of a red LED chip, a blue LED chip, or a green LED chip, where these LED chips may be flip chips or formal chips. Optionally, the LED chip includes but is not limited to a mini-LED, a micro-LED, an organic light-emitting diode (OLED), or the like.

The manufacturing method for a transfer component provided in the implementation has simple processes, and there is no situation that the PDMS stamp is difficult to be separated from the mold. Moreover, the PDMS stamp manufactured with the manufacturing method for a transfer component has a great depth-to-width ratio and a better transfer performance, which is beneficial to improving an efficiency and yield of device transfer and improve a production benefit.

It is to be understood that the disclosure is not to be limited to the disclosed implementations. Those of ordinary skill in the art can make improvements or changes based on the above description, and all these improvements and changes should fall within the protection scope of the appended claims of this disclosure.

What is claimed is:

1. A manufacturing method for a transfer component, the transfer component being configured to transfer light-emitting diode (LED) chips, the manufacturing method comprising:
    disposing an elastic adhesive layer on a surface of a substrate;
    disposing a reticle on the elastic adhesive layer, the reticle comprising hollow areas and convex areas relative to the hollow areas;
    etching the elastic adhesive layer through the hollow areas of the reticle to form a plurality of adhesive bumps used for transferring the LED chips by using the elastic adhesive layer, the convex areas corresponding to the plurality of adhesive bumps; and
    obtaining the transfer component with the plurality of adhesive bumps, by removing the reticle after the etching is completed,
    wherein disposing the reticle on the elastic adhesive layer comprises:
    (i) providing a reticle-manufacturing base plate and a reticle layer formed on the reticle-manufacturing base plate; patterning the reticle layer to form the reticle; binding the elastic adhesive layer and the reticle; and removing the reticle-manufacturing base plate; or
    (ii) disposing a reticle layer on the elastic adhesive layer; and patterning the reticle layer to form the reticle.

2. The manufacturing method for a transfer component of claim 1, wherein patterning the reticle layer to form the reticle comprises:
    disposing a photoresist layer on the reticle layer;
    patterning the photoresist layer to define a plurality of photoresist hollow areas;
    obtaining the reticle with the hollow areas by etching the reticle layer through the plurality of photoresist hollow areas; and
    removing the photoresist layer.

3. The manufacturing method of claim 1, wherein the reticle comprises a reticle basic layer and a reticle sacrificial layer, and when the reticle is disposed on the elastic adhesive layer, the reticle sacrificial layer is located between the reticle basic layer and the elastic adhesive layer.

4. The manufacturing method of claim 3, wherein forming the reticle layer comprises:
    disposing the reticle basic layer on the reticle-manufacturing base plate; and
    depositing the reticle sacrificial layer on the reticle basic layer, to form the reticle layer.

5. The manufacturing method of claim 3, wherein disposing the reticle layer on the elastic adhesive layer comprises:
    disposing the reticle sacrificial layer on the reticle basic layer; and adhering a surface of the reticle sacrificial layer away from the reticle basic layer by using the elastic adhesive layer.

6. The manufacturing method of claim 3, wherein disposing the reticle layer on the elastic adhesive layer comprises:
disposing the reticle sacrificial layer on the elastic adhesive layer; and
disposing the reticle basic layer on the reticle sacrificial layer.

7. The manufacturing method of claim 3, wherein the reticle basic layer comprises a gallium nitride-based (GaN-based) epitaxial layer.

8. The manufacturing method of claim 7, wherein removing the reticle-manufacturing base plate comprises:
separating the reticle-manufacturing base plate from the reticle basic layer by using at least one of a laser with a wavelength of 266 nanometers (nm) or a laser with a wavelength of 355 nm.

9. The manufacturing method of claim 3, wherein removing the reticle comprises:
putting the elastic adhesive layer and the reticle in a target solution, and corroding the reticle sacrificial layer of the reticle by using the target solution, wherein:
the target solution has no effect on the elastic adhesive layer, or a reaction speed of the target solution with the elastic adhesive layer is less than that of the target solution with the reticle sacrificial layer.

10. The manufacturing method of claim 9, wherein the reticle sacrificial layer comprises at least one of a silicon dioxide ($SiO_2$) layer or a silicon nitride ($Si_3N_4$) layer, and the target solution comprises a buffered oxide etch (BOE) solution.

11. The manufacturing method of claim 1, wherein etching the elastic adhesive layer comprises:
dry etching the elastic adhesive layer by an inductively coupled plasma (ICP) etching manner.

12. The manufacturing method of claim 11, wherein dry etching the elastic adhesive layer by the ICP manner comprises:
dry etching the elastic adhesive layer by the ICP manner with at least one of oxygen ($O_2$), argon (Ar), or boron trifluoride ($BCl_3$).

13. The manufacturing method of claim 1, wherein disposing the elastic adhesive layer on the surface of the substrate comprises:
forming the elastic adhesive layer on the substrate by an injection molding process.

14. The manufacturing method of claim 1, wherein the elastic adhesive layer is a polydimethylsiloxane (PDMS) layer, and the transfer component is a PDMS stamp.

* * * * *